PACKAGED SEMICONDUCTOR DEVICES

Filed April 27, 1967 2 Sheets-Sheet 1

INVENTORS
HISAYOSHI YANAI
HUMIKO KIDA
TAKAYUKI YANAGAWA
ISAO TSUBAKI
BY Hopgood & Calimafde
ATTORNEYS April 28, 1970 HISAYOSHI YANAI ET AL 3,509,434

PACKAGED SEMICONDUCTOR DEVICES

Filed April 27, 1967 2 Sheets-Sheet 2

INVENTORS
HISAYOSHI YANAI
HUMIKO KIDA
TAKAYUKI YANAGAWA
BY ISAO TSUBAKI
Hopgood & Calimafde
ATTORNEYS

United States Patent Office 3,509,434

Patented Apr. 28, 1970

3,509,434

PACKAGED SEMICONDUCTOR DEVICES

Hisayoshi Yanai, Humiko Kida, and Takayuki Yanagawa, Tokyo, Japan, and Isao Tsubaki, Chiba-ken, Japan, assignors to Nippon Electric Company Limited, Tokyo, Japan Filed Apr. 27, 1967, Ser. No. 650,557
Claims priority, application Japan, Sept. 30, 1966, 41/64,558
Int. Cl. H01l 1/08, 1/14
U.S. Cl. 317—235 4 Claims

ABSTRACT OF THE DISCLOSURE

A generally planar housing structure for enclosing semiconductor devices for use in high frequency applications. The structure includes a dielectric member for mounting or enclosing the semiconductor with a pair of signal conductors, a common conductor and a ground conductor, the latter conductor being on one generally planar surface of the housing.

FIGS. 1(*a*) and (*b*) are respectively a top view and a cross sectional view of a package according to an embodiment of this invention with the top cover for hermetically sealing the package removed.

Background of the invention

Figure 1A:
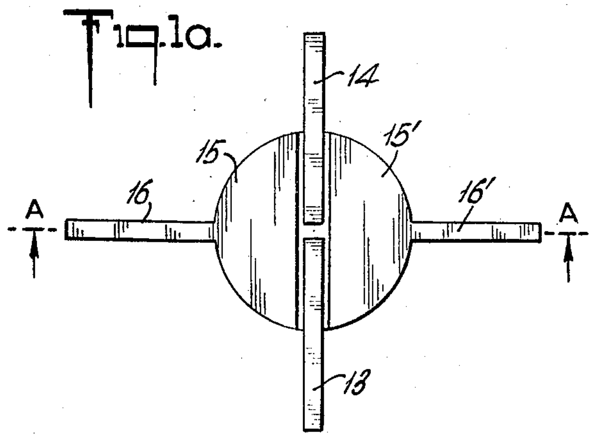

This invention relates to packages for enclosing semiconductor devices and more particularly to new and improved flat packages structures adapted for enclosing semiconductor devices which have high frequency applications.

Semiconductor devices such as diodes, transistors, or integrated circuits are rarely used without packaging; they are invariably used in hermetically sealed enclosures or packages for ease of handling and for protecting the semiconductor per se from the entrance of dust or moisture in the atmosphere.

Metallic or synthetic-resin-made packages of cylindrical form (plug-in type) with leads protruding downward from the bottom surface have been widely used recently. With a semiconductor device enclosed in a hermetically sealed package, electrical energy is usually coupled into or out of a semiconductor element invariably via leads associated with the package. Especially when the device is to be used at high frequencies (for example, in or above the VHF region), the parasitic elements such as leads, cover or cap, etc. will adversely affect the performance of the semiconductor element, resulting in various disadvantages such as failure of coupling of electrical energy into or out of the element, delay in the time of transmission of the energy, unwanted parasitic oscillations or resonance, etc. Among the causes for the disturbance are lead inductance, resistive components due to the skin effect at high frequencies, inter-lead capacitance, and lead capacitance to ground.

As those knowledgeable in the art are aware, conventional plug-in type packages for semiconductors are suited for use at frequencies up to approximately 1 gc. at most. Now the performance of the semiconductor pellet per se has been markedly improved recently, the theoretical maximum frequency of oscillation of some transistors reaching as high as 10 gc. As a consequence, the H-F performance of semiconductor devices is much more restricted by package design than by performance of the semiconductor per se.

There are three general types of transmission lines for coupling H-F signals to the semiconductor: waveguide, coaxial, and stripline structures. Package design must be suited for coupling energy into or out of the semiconductor pellet with the transmission mode and characteristics of the external line substantially unchanged. For this purpose, several types of packages adapted for the previously mentioned three types of lines have been developed.

Of these three types of transmission lines, the stripline is known as consisting of a conductor strip for signal transmission and a planar ground conductor facing the same and separated by a dielectric layer. This geometry has been favored in that it can be easily realized as printed circuitboards or thin film circuits. Moreover, stripline packages are superior to other types of packages in ease of fabrication, inexpensive cost, and in reduced weight and compactness.

Stripline packages are generally designed extremely flat with leads in strip form extending radially beyond the boundary of a flat enclosure in a plane containing substantially the flat enclosure as is evidenced by the "MICRODISK," a registered trade name in the U.S. for a transistor package structure for stripline use. This type of structure will hereinafter be referred to as the "flat package" structure.

The potential on the lower conductor (ground conductor) of the previously mentioned pair of conductors (signal conductor in strip form and ground plane or conductor which has an area larger than the signal conductor) need not be maintained equal to ground potential for electronic apparatus in which the stripline package is incorporated; the ground conductor may at times be grounded for A-C. (The term "grounded for A-C" means that the conductor of interest is maintained at ground potential through an electrostatic capacitance whose magnitude of impedance can substantially be neglected in the operating frequency region.) Therefore a semiconductor stripline package should preferably be equipped with a third conductor to be maintained at direct-current ground potential in addition to the signal conductor and the ground conductor.

With a typical three-lead semiconductor device such as the transistor, there is provided invariably a common lead to serve as a pair with each of input and output signal leads. In a grounded-emitter transistor amplifier, for example, the input signal is applied across the base and the emitter, while the output signal is derived from across the collector and the emitter. Thus the conductors connected respectively to the base and the collector are called the input and the output conductor, while the conductor connected to the emitter is called the common conductor because it is used in common for the input and the output. The common conductor should be differentiated from the previously mentioned third conductor to be maintained at ground potential. In the following general description of semiconductor packages, the conductor, to become a pair with the signal conductor and the third conductor will be respectively referred to as the common and the ground conductor.

Desirable requirements or conditions for semiconductor packages for high frequency applications are as enumerated below.

(1) Characteristic impedance of each signal conductor (lead) from the external package wall through to the semiconductor should be as uniform as possible and matched to the external system.

(2) The plurality of leads should be electrostatically and electromagnetically shielded from one another.

(3) The internal region of the package should be electrostatically and electromagnetically shielded from any external electric or magnetic field.

(4) Both the common conductor inductance and the ground conductor inductance should be sufficiently small.

(5) The common conductor should be grounded for A-C within the package with respect to ground conductor.

The high-frequency performance of the conventional flat packages has been markedly improved over the cylindrical plug-in type packages, because their sizes are inherently much more compact and naturally the impedances of parasitic elements are reduced. However, the previously mentioned requirements are not met by conventional flat type packages.

Objects of the invention

One of the prime objects of the present invention is to provide flat packages for semiconductors which have excellent high-frequency performance and which also meet the requirements set forth above.

All of the objects, features and advantages of this invention and the manner of attaining them will become more apparent and the invention itself will be best understood by reference to the following description of the invention taken in conjunction with the accompanying drawings.

General description of the invention

Stated very broadly, the package of this invention comprises a generally flat or planar type enclosure, signal conductors (leads), a common conductor, and a ground conductor covering substantially the entirety of at least one planar surface of the flat enclosure.

Stated more particularly, the flat package of the following: A pair of signal conductors provided on the top surface of a dielectric plate, a ground conductor bonded to the bottom surface of the dielectric plate, parallel to the top surface, a common conductor installed on the top surface at each side (or at one side) of the pair of signal conductors in such a manner that a uniform clearance may be produced therebetween, the surface of the common conductor and the surface of the pair of signal conductors may be coplanar, and the common conductor may extend substantially over the entire top surface of the dielectric except for the part covered by the pair of signal conductors.

The characteristic impedance of a lead strip as a signal conductor is generally determined both by width and thickness of the signal conductor and by dielectric constant and thickness of the dielectric.

The theoretical value of the characteristic impedance can be derived only on the assumption that both the ground conductor and the dielectric are infinitely extended. If otherwise, the value must be derived experimentally.

In cases where signal conductors are in strip form and the dielectric is uniformly thick, as with packages according to this invention, the characteristic impedance of each signal conductor can be designed uniformly throughout its length and further, if required, can be controlled by varying the dielectric thickness or the signal conductor width. In other words, the first item of the previously mentioned requirements can be met.

According to another teaching of this invention, a common conductor should be present on each side or on either side of a plurality of signal leads in close proximity thereto and a ground conductor disposed in proximity to the upper and/or the lower surface of the plurality of signal leads. Therefore the signal conductors are electrostatically shielded from one another.

Incidentally, electrostatic shielding alone is sufficient, in most cases, for semiconductor packages for high-frequency applications. It can be anticipated that the characteristic impedances of signal leads are caused to vary by the presence of a third conductor (common conductor) disposed in proximity to the signal leads. Experimentation with our packages shows this to be untrue. The characteristic impedance of each signal lead remained substantially unchanged by the presence of the third conductor even if the clearance was sufficiently narrowed (say, 0.1 mm.) within the scope of dielectrics available on market and practicable dimensions. Thus the tolerances for the clearance between signal and common conductors need not be too rigorous. To sum up, the present package structures meet the second item of the previously mentioned requirements.

According to still another teaching of this invention, the ground conductor or plane should be applied on an external wall surface of the package. Therefore the internal region of the package is electrostatically shielded from the external and further, if a ferromagnetic material of high magnetic permeability is used as the ground plane as required, electromagnetic shielding can be provided as well. This meets the third item of the previously mentioned requirements. Although it is desirable for this purpose that as large an area as possible of the external package walls be covered with the ground conductor, it is an essential condition according to this invention that at least one planar surface of the package be covered with the ground plane.

It has been mentioned by one of the present inventors in the specification of another patent application that parasitic inductances incidental to the common conductor and the ground conductor adversely affect the semiconductor performance. Where the wide common and ground conductors lie flat on the dielectric surface as in this invention, the parasitic inductances may be reduced compared with thin circular conductors. A plurality of complements for the common conductor may be installed on the dielectric surface in lieu of a single common conductor. Thus the fourth item of the requirements is fulfilled.

According to a further teaching of this invention, a planar common conductor is disposed in opposed relationship with a planar ground conductor via a dielectric. Therefore an electrostatic capacitance is formed between the two conductors and the common conductor is grounded for A-C inside the package. Obviously, the fifth item of the previously mentioned requirements is met.

It has been common practice with conventional packages that alternating-current grounding of the common conductor was carried out by connecting a capacitor outside of the package. This practice called for installation of a capacitor and was subject to the adverse effect of parasitic elements such as lead inductance incidental to the capacitor. Free from these disadvantages, the present invention is featured by simplicity of circuit structure and reliability of operation.

Increasing the value of the grounding capacitance could be attained by any one of the following three methods:

(1) Increasing the area in which the common conductor and the ground conductor directly face each other.

(2) Reducing the thickness of the dielectric sandwiched between the two conductors as compared with that between the signal and the ground conductor.

(3) Increasing the dielectric constant of the dielectric sandwiched between the two conductors as compared with that of the remaining portion.

Where the magnitude of the capacitance corresponding to the area mentioned in (1) immediately above is insufficient, a capacitor to compensate for the insufficient capacitance may be connected outside of the package. Even in this case, the outside electrostatic capacitance will be smaller than the conventional structures and the adverse effect of the parasitic elements relieved.

The short-circuit state of the common conductor and the ground conductor may be construed, in a broad sense, as "grounded for A-C" condition. Therefore, even if both conductors are short-circuited with a conductor outside of the package, the common conductor is invariably grounded for A-C inside of the package according to package structures of this invention. Thus the effect of the shorting conductor inductance can be neglected. As a measure for achieving economy in time and labor for short-circuiting the common and the ground conductor, a particular package construction is recommended such that the common and the ground conductor are short-circuited at least at one point in the interior or on an external wall of the dielectric.

Detailed description of preferred embodiments

Figure 1B:
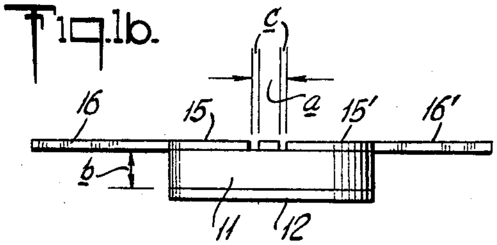

FIGS. 1(*a*) and (*b*) illustrate respectively a top view and a side elevational view for an embodiment of a three-lead semiconductor (triode) package prior to mounting a semiconductor pellet and hermetically sealing the package with the top cover or cap.

As illustrated, a ground conductor or plane 12 is installed on the entire bottom surface of dielectric 11 in circular disk form, while input lead 13, output lead 14, and common conductor 15 and 15′ are all installed on the top surface of the dielectric. Both input and output leads 13 and 14 are in strip form and aligned, the free end of each extending beyond the boundary of the dielectric disc 11 to serve as a terminal for the external circuit. The complements for the common conductor 15 and 15′ are disposed on both sides of input leads 13 and 14 which are aligned so as to produce the same uniform clearances and cover the entire remaining surface of the dielectric 11. Strips 16 and 16′ respectively integral with 15 and 15′ serve as terminals for connection to external circuits. A terminal may be provided for ground plane 12. Bonding the entire ground plane securely to a wide conducting plate with solder is a preferred semiconductor mounting method in improving heat dissipation capabilities. For application of this method to this embodiment, the ground plane 12 is not provided with a terminal in the illustration.

Figure 2:
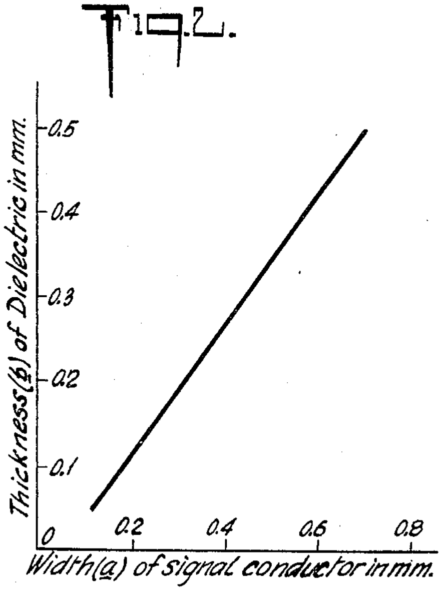
FIG. 2 is a graph of design information for the package of FIG. 1 giving the dimensional proportions for the structure.

In fabricating the package structure of FIG. 1, the following materials were used: Oxygen free copper strip, 0.08 mm. in thickness, for each of the conductors; and steatite (with dielectric constant of approximately 6 and specific permeability of approximately 1) for the dielectric 11. Design information as shown in FIG. 2 was obtained by the present inventors with package structures according to this embodiment in which both leads 13 and 14 are disposed with respect to 12 so as to ground plane have the uniform characteristic impedance of 50 ohms.

This information gives dimensional relations for the width *a* (mm.) of each signal conductor 13 and 14 and the thickness *b* (mm.) of dielectric 11 to make the characteristic impedance typically 50 ohms. Obviously, these dimensions are within a practically realizable range. It was confirmed by our experiment that the characteristic impedance is substantially unaffected in spite of diminishing the clearance *c* on each side of signal conductor to a distance as small as 0.1 mm. or increasing the thickness of the signal conductor to a dimension twice the order of twice 0.08 mm. It will be evident by one skilled in the art that the thickness of each conductor and the clearance between any two conductors shown in FIG. 1 are designed to dimensionally match the external line. The dimensions of a package as an experimental model which was designed to match a 50-ohm transmission line on the basis of the foregoing experimental data are as follows:

Diameter of steatite disc 11—3.5 mm.
Thickness *b* of steatite disc 11—0.4 mm.
Width *a* of signal lead—0.6 mm.
Thickness of signal conductors 13 and 14 and common conductor 15 and 15′—0.08 mm.

Clearance *c* between 13 or 14 and 15 or 15′—0.2 mm.
Clearance between tip ends of 13 and 14—0.2 mm.
Width of leads 16 and 16′—0.6 mm.

Although the complementary portions 15 and 15′ comprising the common conductor should be short-circuited either inside or outside of the package, the short-circuited portion is not illustrated in FIG. 1 for simplicity. With this structure, common conductor complements 15 and 15′ are disposed on both sides of signal conductors 13 and 14 in proximity thereto and ground plane 12 is installed on the opposite side of the dielectric 11. Therefore two signal conductors 13 and 14 can be perfectly shielded electrostatically from each other. Moreover, a thin strip may be inserted in the clearance between the tip ends of signal conductors 13 and 14 for joining together the two semicircular complements for the common conductor in order to make shielding perfect. Although not illustrated, this configuration would be a modification to the embodiment of FIG. 1. It will be also appreciated by one skilled in the art that the semicircular configuration of 15 or 15′ is more effective for the reduction of parasitic inductances than if the common conductor were composed of only two lead strips.

The two lead strips 16 and 16′ for the common conductor is for reducing the parasitic inductances incidental to the common conductor leads as has been referred to above. A capacitance is created between the common conductor composed of two semicircular parts 15 and 15′ and the circular ground plane 12, contributing to A-C grounding of both conductors 15 and 15′.

Figure 3:
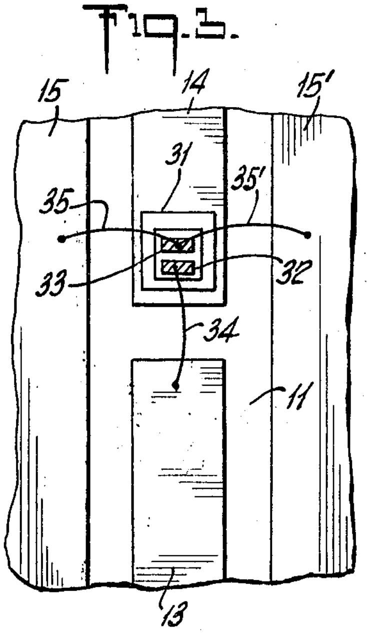
FIG. 3 is an enlarged top view of the central portion of the package of FIG. 1 with a transistor incorporated therein.

FIG. 3 is an enlarged top view of the central portion of FIG. 1 with a diffused transistor pellet 31 mounted and leads 34, 35, and 35′ bonded thereto in a manner to provide a grounded-emitter amplifier.

The base, collector, and the emitter of the grounded-emitter amplifier are respectively used as the input, output, and the common electrode. On one surface of the diffused transistor pellet 31 are formed the base and the emitter electrode 32 and 33 according to common practice and on the opposite surface is formed the collector electrode (not illustrated).

Bonding the collector with the output conductor 14 is performed by alloying the bottom surface of the transistor pellet 31 with the output conductor 14 as normally done in the fabrication of diffused transistors. Bonding the base electrode 32 with input conductor 13 and the emitter electrode 33 with common conductors 15 and 15′ is performed by the thermo-compression bonding technique using thin gold or aluminum wires 34, 35, and 35′.

In the embodiment of FIG. 3, conductors 15 and 15′ are maintained at equal potential by use of thin wires 35 and 35′. For welding of pellet 31 to output conductor 14 and thermo-compression bonding of thin wires 34, 35, and 35′, it is desirable that copper conductors 13, 14, 15, and 15′ each be plated with a thin gold layer. Although it is true that use of thin wires for interior wiring is undesirable for reducing lead inductances, this explanation is made simply by way of example and obviously any other more suitable mounting method such as beam lead or ball bonding techniques could be employed for this structure as desired. Incidentally, in fabricating a grounded-base transistor according to this invention, it is only necessary to connect emitter electrode 33 to signal conductor 13 and base electrode 32 to common conductor 15 and 15′.

In mounting the semiconductor pellet, the package should be subjected to a high temperature of the order of 300–500° C. A bonding method capable of withstanding a high temperature for each of copper conductors 12, 13, 14, 15, and 15′ and steatite 11 may be accomplished, for example, as follows:

A copper strip of predetermined width and thickness is thoroughly cleansed through the processes of degreasing, etching by use of a dilute nitric acid solution, rinsing with water, and drying. This strip is placed on a steatite plate with the intervention of a soda glass plate, 0.12 mm. in thickness, having a similar shape as the steatite plate. This assembly is clamped with a jig made of graphite and is heated for 15 minutes at a temperature between 950 and 980° C. with a suitable compression force applied.

As a result, the soda glass melts over the steatite surface in such a manner that the glass surface is flush with the conductor surface. In other words , the soda glass plate serves as a binding agent for binding the conductor securely onto the steatite surface 11. Since the dielectric constant of the soda glass is approximately equal to that of the steatite, the necessity for reducing the steatite thickness by an amount equal to the thickness of a glass layer to be interposed between the conductor and the steatite plate may arise. Actually, however, the thickness of the glass binding agent was less than 0.1 mm. and hence, can be substantially ignored. According to our experiments, favorable binding performance was also obtained by use of chromium-plated 4–2–6 Cr-Fe-Ni alloy or 5–2 Fe-Ni alloy in addition to the copper conductor.

It has been found by extensive experimentation with various kinds of ceramics for the dielectric such as beryllia, spinel, and alumina ceramics that improved packages both in H-F performance and in heat dissipation could be obtained.

It is necessary to maintain shapes and relative positions of individual conductors as uniform as possible within the same enclosure or between enclosures in order to obviate variation of H-F performance in the manufacture of packages. This is particularly true of precise control in manufacture should be called for the two opposing conductors separated by a dielectric such as signal and ground conductors or ground and common conductors, accordingly precise manufacturing controls should be employed.

Figure 4:
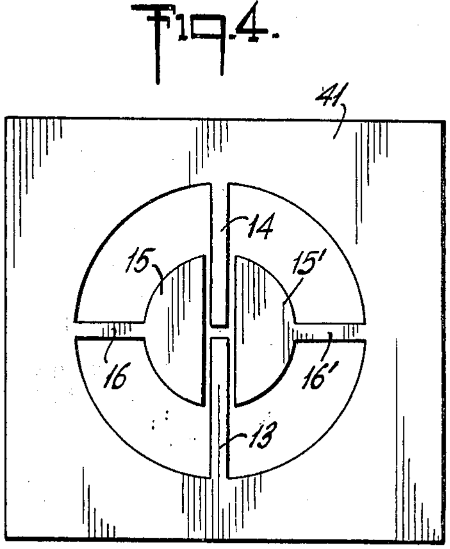
FIG. 4 is a top view of a base ribbon pattern for use in the fabrication of the package shown in FIG. 1.

A manufacturing method suitable for this purpose is illustrated in FIG. 4. A pattern as illustrated in FIG. 4 is perforated in a sheet of conducting metal 41 so as to produce signal conductors 13 and 14 and common conductors 15 and 15′. After the circular portion of the perforated sheet has been bonded to a dielectric plate with soda glass, the circumferential part of 41 around the circle should be removed. Mechanical punching or chemical etching may be used to perforate a complex pattern uniformly in the conducting plate 41. Any other known technique such as vacuum evaporation or sintering of a conductive layer may be substituted for the previously mentioned method for bonding the layer onto the dielectric surface.

After the semiconductor pallet has been mounted and wiring therefor finished, the hermetic seal process for the enclosure should be performed.

According to our experiment, variation in the characteristic impedance of each signal conductor could be substantially neglected even if the signal conductor was covered with a dielectric cover or cap of the same material as the lower dielectric base. For instance, the same method that is applied for the "MICRODISK" (trade name) as illustrated in FIG. 5 can be applied for hermetically sealing the package structure shown in the embodiment of FIG. 1.

Figure 5:
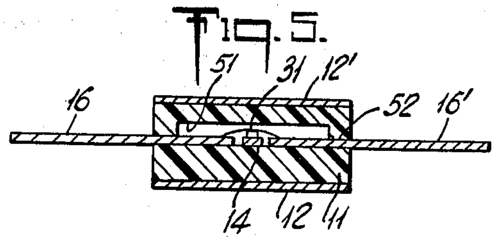
FIG. 5 is a diagrammatic cross sectional view of the package of FIG. 1 with the top cover in place, and the structure hermetically sealed.

FIG. 5 is a diagrammatic cross sectional view of such a package along A–A′ in FIG. 1. In FIG. 5 that a steatite cover or cap 51 having a central cavity and a circumference approximately conforming to the circumference of the steatite plate 11 is bonded thereto. The hermetic seal process is carried out by glazing a low melting glass on the circumference 52 of the cap, pressing the cap against the package, and by passing the assembly through an oven at a temperature higher than the melting point of the glass.

In the embodiment shown in FIG. 5, an additional ground plane 12′ is installed on the top surface of the cap 51. The two ground planes 12 and 12′ should be short-circuited in operation so as to become equipotential, although not so illustrated in FIG. 5. The addition of ground plane 12′ helps to make electrostatic shielding perfect.

Any other suitable sealing method such as molding with a resin material may be used in lieu of the sealing method. Depending on the method of sealing, the characteristic impedance of the signal conductor may be affected. This, however, does not become an impediment in practicing the invention, because the characteristic impedance itself can be suitably controlled before the sealing process in anticipation of the variation.

It is the prime object of semiconductor packages according to this invention to establish an electrostatic capacitance between the common conductor and the ground conductor. With the package structure for the embodiment of FIG. 1, the achievement of sufficient A-C grounding by the electrostatic capacitance alone is normally difficult, unless an additional capacitor be connected externally. For example, the electrostatic capacitance for a steatite disc of 3.5 mm. in diameter and 0.4 mm. in thickness in FIG. 1 was of the order of 1 pf. One method for increasing the electrostatic capacitance is to increase the area of the dielectric layer.

Figure 6:
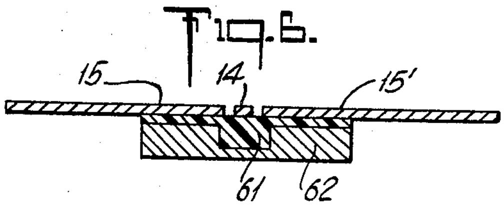
FIGS. 6 through 8 are diagrammatic cross sectional views of packages according to other embodiments of this invention with their respective covers removed.

An embodiment of still another method and structure for increasing the capacitance is illustrated in FIG. 6. FIG. 6 shows a cross section of a package for a three-lead semiconductor having the same plane view as FIG. 1(*a*), wherein the thickness of the dielectric layer has been varied locally. This structure increases the electrostatic capacitance (15–62 or 15′–62) by making the dielectric layer sandwiched between ground conductor 62 and common conductor 15 and 15′ thinner than that between signal conductor 14 and ground conductor 62.

Figure 7:
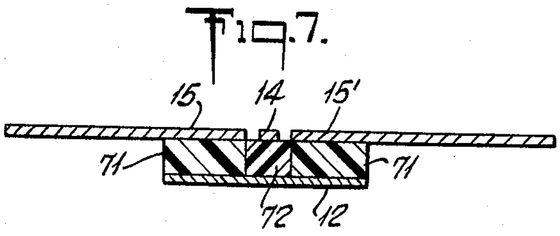

An embodiment for still another method for increasing the electrostatic capacitance is illustrated in FIG. 7. FIG. 7 is a cross section of a package for a three-lead semiconductor having the same plan view as FIG. 1(*a*), wherein the dielectric constant of the dielectric layer has been varied locally. It will be seen that the electrostatic capacitance can be increased by making the dielectric constant of a dielectric sandwiched between ground conductor 12 and common conductor 15 and 15′ larger than that between ground conductor 12 and signal conductor 14.

Figure 8:
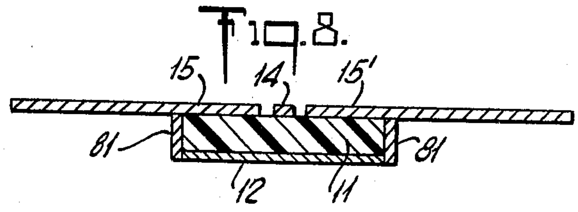

FIG. 8 is a diagrammatic cross sectional view for a further embodiment of this invention having substantially the same plan and cross sectional views as FIGS. 1(*a*) and (*b*), wherein both common conductor 15 and 15′ and ground conductor 12 are short-circuited at the side wall of the dielectric 11 with a conductive layer 81 for the purpose of maintaining the common conductor and the ground conductor at exactly the same potential. For the formation of a conductive layer 81, any other suitable method such as the conductive paint brazing or metal sintering method can be employed. Utilization of a part of the external wall of a package for shorting the common and the ground conductor is advantageous in decreasing the inductance of the shorting conductor and saving labor for short-circuiting. Further, short-circuiting at the external periphery of the dielectric is advantageous in that this work can be performed simultaneously with the fabrication work of the package per se.

Any one of the three embodiments of FIGS. 6 through 8 shows a cross section of a package prior to mounting a semiconductor pellet and hermetically sealing the package. For the subsequent sealing process, any known method can be used.

An incidental advantage of the previously mentioned package structures is marked improvements in heat dissipation capabilities of the packages, because the ground conductor bonded to the planar top and/or the bottom surface of the enclosure may be attached to or soldered, as required, to a metal plate adapted for heat dissipation.

In any one of the embodiments, it has been assumed that a pair of signal conductors are aligned and each conductor is in linear strip shape. Our experiment demonstrated that the characteristic impedance of a signal conductor was substantially unaffected in spite of bending the conductor at an angle as acute as 90 degrees on the dielectric and further, that suitable modifications could be made to the geometry of signal conductors or their relative positions without substantially degrading the package performance. The geometry of the dielectric should by no means be restricted to circular form; any other suitable shape may be adopted as required.

While a description has ben made above of embodiments in all of which a transistor was used as a semiconductor element, it is to be clearly understood that the field of this invention should by no means be restricted thereto; the advantages can obviously be obtained by applying this invention to field-effect transistors, integrated circuits, or any other kinds of semiconductor devices.

Moreover, although any one of the embodiments was concerned with a case in which signal conductors consisting of an input conductor and an output conductor, the present invention can equally be applied with the equivalent effect to cases in which only one signal conductor is provided as with diodes or three or more as with integrated circuits.

Still further, any one of the embodiments is concerned with the case in which the two complements of the common conductor, or one conductor on each side of a pair of signal conductors, are provided, but it will be obvious that a single conductor as the common conductor may be provided on either side of the signal conductors or a plurality of complements for the common conductor may be provided depending on the number of signal conductors without departing from the scope of this invention.

Accordingly, package structures for semiconductor devices according to this invention may be fabricated in a variety of ways as exemplified hereinunder.

(1) Flat package structures for semiconductor devices characterized by comprising in combination an enclosure made of a dielectric for enclosing a semiconductor pellet, at least one surface of said enclosure being planar, a plurality of lead strips extending beyond the boundary of said flat enclosure outwardly in the plane in which said flat enclosure is substantially contained to serve as the signal conductors and the common conductor, and a ground conductor bonded to the planar surface of said enclosure.

(2) Flat package structures for semiconductor devices characterized by comprising in combination a flat enclosure made of a dielectric for enclosing a semiconductor pellet, at least one surface of which is designed substantially planar, a plurality of lead strips extending beyond the boundary of said flat enclosure outwardly in a plane in which said flat enclosure is substantially contained to serve as the signal conductors and the common conductor, a substantially planar ground conductor bonded to at least one of the planar surfaces of said flat enclosure so as to cover substantially the entire surface thereof and spaced from said signal conductors through parallel surfaces of a dielectric layer within said flat enclosure, and means for disposing said common conductor in such a manner that the complements for said common conductor may be present along either side at least of said signal conductors in a lengthwise direction thereof and spaced at a uniform clearance therefrom, the surfaces of said common conductor may be substantially coplanar with the surface of said signal conductors and extending so as to have substantially the same peripheral configuration as said ground conductor, and said common conductor may be confronted with said ground conductor by the intervention of a dielectric layer.

(3) Semiconductor package structure according to item (2) above characterized in that the thickness of the dielectric layer sandwiched between the common conductor and the ground conductor is made thinner than that between the signal conductors and the ground conductor.

(4) Semiconductor package structures according to item (2) above characterized in that the dielectric constant of the dielectric layer sandwiched between the common conductor and the ground conductor is made larger than that of the dielectric layer between the signal conductors and the ground conductor, (5) Semiconductor package structures according to item (2) above characterized in that the common and the ground conductor are short-circuited inside or at the periphery of the dielectric layer interposed between the common and the ground conductor.

While the foregoing description set forth the principles of the invention in connection with specific apparatus, it is to be understood that the description is made only by way of example and not as a limitation of the scope of the invention as set forth in the accompanying claims.

What is claimed is:

1. A flat package structure for a semiconductor device comprising a generally flat enclosure of a dielectric material for enclosing a semiconductor pellet, said enclosure having at least one substantially planar surface, a plurality of lead strips extending outwardly beyond the boundary of said flat enclosure and being generally in the plane in which said flat enclosure is substantially contained to serve as signal conductors and a common conductor, a substantially planar ground conductor bonded to said substantially planar surface so as to cover substantially the entire area of said surface, said ground conductor being disposed in opposed facing relationship with said signal conductors with a dielectric layer therebetween, said common conductor being formed of a plurality of complementary member portions, said complementary member portions being disposed adjacent opposite sides of said signal conductors in a lengthwise direction thereof and at the same uniform clearances therefrom, the surface of said common conductor being substantially coplanar with the surface of said signal conductors and having substantially the same peripheral configuration as said ground conductor with a dielectric layer therebetween.

2. The invention described in claim 1 wherein the thickness of the dielectric layer between the common conductor and the ground conductor is made thinner than that between the signal conductors and the ground conductor.

3. The invention described in claim 1 wherein the dielectric constant of the dielectric layer between the common conductor and the ground conductor is greater than that of the dielectric layer between the signal conductors and the ground conductor.

4. The invention described in claim 1 wherein the common conductor and the ground conductor are short-circuited together by a conducting means connected therebetween.

References Cited

UNITED STATES PATENTS

| | | | |
|---|---|---|---|
| 3,171,187 | 3/1965 | Ikeda et al. | 317—235 X |
| 3,271,625 | 9/1966 | Caracciolo | 317—101 |
| 3,271,634 | 9/1966 | Heaton | 317—234 |
| 3,320,353 | 5/1967 | Smith | 317—234 X |

JAMES D. KALLAM, Primary Examiner

U.S. Cl. X.R.

317—234